United States Patent [19]

Larson

[11] Patent Number: 5,580,814

[45] Date of Patent: Dec. 3, 1996

[54] METHOD FOR MAKING A FERROELECTRIC MEMORY CELL WITH A FERROELECTRIC CAPACITOR OVERLYING A MEMORY TRANSISTOR

[75] Inventor: William L. Larson, Colorado Springs, Colo.

[73] Assignee: Ramtron International Corporation, Colorado Springs, Colo.

[21] Appl. No.: 527,175

[22] Filed: Sep. 11, 1995

Related U.S. Application Data

[62] Division of Ser. No. 257,954, Jun. 10, 1994, Pat. No. 5,495,117, which is a continuation of Ser. No. 68,285, May 27, 1993, abandoned, which is a continuation of Ser. No. 706,874, May 29, 1991, abandoned.

[51] Int. Cl.⁶ .......................... H01L 21/70; H01L 27/00
[52] U.S. Cl. .................. 437/52; 437/60; 437/919
[58] Field of Search .................. 437/919, 52, 60; 257/295; 365/145

[56] References Cited

U.S. PATENT DOCUMENTS

| | | | |
|---|---|---|---|
| 4,536,942 | 8/1985 | Chao et al. | 257/280 |
| 4,649,406 | 3/1987 | Takemae et al. | 257/300 |
| 4,707,897 | 11/1987 | Rohrer et al. | 257/295 |
| 4,873,664 | 10/1989 | Eaton, Jr. | 365/145 |
| 4,888,630 | 12/1989 | Paterson | 357/23.5 |
| 4,893,272 | 1/1990 | Eaton, Jr. et al. | 365/145 |
| 4,937,650 | 6/1990 | Shinriki et al. | 357/51 |
| 5,005,102 | 4/1991 | Larson | 361/313 |
| 5,024,964 | 6/1991 | Rohrer et al. | 437/47 |
| 5,046,043 | 9/1991 | Miller et al. | 357/23.6 |
| 5,068,199 | 11/1991 | Sandhu | 437/52 |
| 5,229,309 | 7/1993 | Kato | 437/60 |

FOREIGN PATENT DOCUMENTS

| | | | |
|---|---|---|---|
| 338157 | 9/1988 | European Pat. Off. | 11/22 |
| 0338157 | 10/1989 | European Pat. Off. | G11C 11/22 |
| 396221 | 6/1990 | European Pat. Off. | 11/22 |
| 0396221 | 11/1990 | European Pat. Off. | G11C 11/22 |
| 0478799 | 4/1992 | European Pat. Off. | H01L 29/792 |
| 61-1048 | 1/1986 | Japan | 257/306 |
| 61-145854 | 7/1986 | Japan | 257/310 |
| 2-49471 | 2/1990 | Japan | 257/295 |
| 2-183569 | 7/1990 | Japan | H01L 29/788 |
| 2238660 | 9/1990 | Japan | 257/306 |

OTHER PUBLICATIONS

Womack et al., "A 16 Kb Ferroelectric Nonvolatile Memory With A Bit Parallel Architecture", *IEEE International Solid-State Circuits Conference* (Feb., 1989).

Kinney et al., "A Non-Volatile Memory Cell Based on Ferroelectric Storage Capacitors" IEEE IEDM, 1987, pp. 850–851.

*Primary Examiner*—H. Jey Tsai
*Attorney, Agent, or Firm*—Holland & Hart LLP

[57] ABSTRACT

A ferroelectric memory cell has an FET covered by an insulation layer and a ferroelectric capacitor located thereover. An interconnect couples an upper plate of the ferroelectric capacitor to a source/drain of the transistor. In a method of forming the cells, after the transistor is fabricated, the bottom electrode and ferroelectric dielectric are established, but the top capacitor electrode is not added until a further layer of insulation is added over the ferroelectric and windows are opened in it. One window is for the top electrode and another window is to one source/drain region of the FET.

21 Claims, 5 Drawing Sheets

METHOD FOR MAKING A FERROELECTRIC MEMORY CELL WITH A FERROELECTRIC CAPACITOR OVERLYING A MEMORY TRANSISTOR

This application is a division of U.S. application Ser. No. 08/257,954 filed on Jun. 10, 1994, U.S. Pat. No. 5,495,117, which is a continuation of prior application Ser. No. 08/068,285, abandoned, filed on May 27, 1993 which is a continuation of prior application Ser. No. 07/706,874, abandoned, filed on May 29, 1991.

BACKGROUND OF THE INVENTION

The present invention is directed to capacitors used in a memory cell structure and in particular those using a ferroelectric material for dielectric.

A ferroelectric memory cell uses a capacitor with a ferroelectric material as all or part of the dielectric between the plates of the capacitor. The plates are usually flat and generally planar. Generally, the remanent polarization of dipoles in the ferroelectric material is the physical phenomenon or attribute by which data is stored in a non-volatile memory, as outlined in, e.g., Ramtron's U.S. Pat. Nos. 4,873,664 ("Self Restoring Ferroelectric Memory") and U. S. Pat. No. 4,893,272 ("Ferroelectric Retention Method"). In addition, ferroelectric capacitors can be used in volatile memory cells also, as in Ramtron's Australia Patent No. AU-B- 25817/88 ("Charge Magnified DRAM Cell"). Furthermore, Ramtron's U.S. Pat. No. 5,005,102 ("Multilayer Electrodes For Integrated Circuit Capacitors") to the present inventor discloses a multilayer capacitor structure in an integrated circuit.

Currently, ferroelectric memory cells are laid out one of two ways. One lay-out locates the ferroelectric capacitor directly above a source/drain contact, as in Ramtron's European Patent Publication 396,221 ("Integrated Ferroelectric Capacitor") and European Patent Publication 338,157 ("Charge Magnified DRAM CELL"). The ferroelectric material thereby contacts a transistor via the source/drain contact and a bottom electrode of the capacitor. Material and process limitations can impede practical implementation of this layout because the interface between the bottom electrode and the substrate (usually silicon) in the source/drain contact is unstable at the temperature required for subsequent processing.

In another layout, a ferroelectric capacitor is located adjacent to a transistor. A source/drain contact is connected to the capacitor using aluminum metallization. The memory cell, using this layout requires a larger area, making it less attractive for use in high density memory products.

Another problem with the current designs for a ferroelectric capacitor involves the fabrication of a top electrode. With current methods, the top electrode is defined by a deposition and lithographic step. An insulating layer is then deposited over the top electrode, and a contact to the top electrode is then processed. Accordingly, the top electrode has to be sufficiently large in size to insure that the contact or hole through the insulating layer is (completely) within the boundary of the top electrode. As a result, a larger than desired top electrode area is required. Such an oversized top electrode is not desirable because it requires a larger area than other methods, making it less attractive for high density memory products.

The main object of the present invention is to provide a method and structure for a ferroelectric capacitor to be coupled to a switching device, e.g. a transistor, which does not suffer from the drawbacks described above.

SUMMARY OF THE INVENTION

The present invention in one of its aspects is directed to a stacked ferroelectric memory cell for use in volatile and nonvolatile random access memories. The stacked ferroelectric memory cell results from a layout that positions a ferroelectric capacitor located directly above a transistor and a configuration where the capacitor is insulated from at least a portion of the transistor thereunder. An interconnect is used to couple an upper plate of the ferroelectric capacitor to a source/drain of the transistor. In the preferred embodiment, a bottom electrode is located directly over a transistor with an insulating layer between the two. A ferroelectric material is then located over the bottom electrode. Another insulating layer is located over the ferroelectric material. A contact window is defined through the insulation to the ferroelectric, and a top electrode is located in the contact window. An interconnect couples the ferroelectric capacitor to the source/drain of the transistor.

This configuration results in a small capacitor area. Further, the resulting ferroelectric memory cell of the present invention takes up a relatively small area because of the stacking of the ferroelectric capacitor above the transistor. Another attribute of this cell is its improved manufacturability.

The present invention is further directed to a method for forming a stacked ferroelectric memory cell. In general, the method comprises a sequence of steps wherein a transistor is formed and a bottom electrode and ferroelectric dielectric assembly are established on a first insulation layer over the transistor. Further, a second insulation layer is established over the ferroelectric layer. A selected portion of the upper surface of the ferroelectric layer is exposed. Thereafter, a top electrode, which is coupled electrically between the exposed portion of the ferroelectric and a region of transistor, is established.

BRIEF DESCRIPTION OF THE DRAWINGS

In describing the preferred embodiment, reference is made to the accompanying drawings wherein like parts have like reference numerals, and wherein.

DETAILED DESCRIPTION OF THE PREFERRED EMBODIMENT

Figure 1:
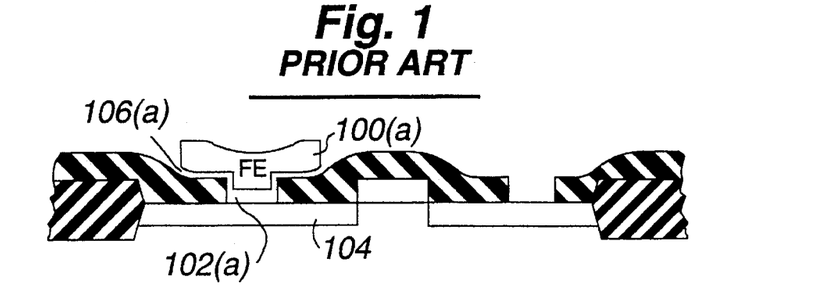
FIG. 1 is a cross-sectional view of a memory device produced by a prior method.
Figure 1A:
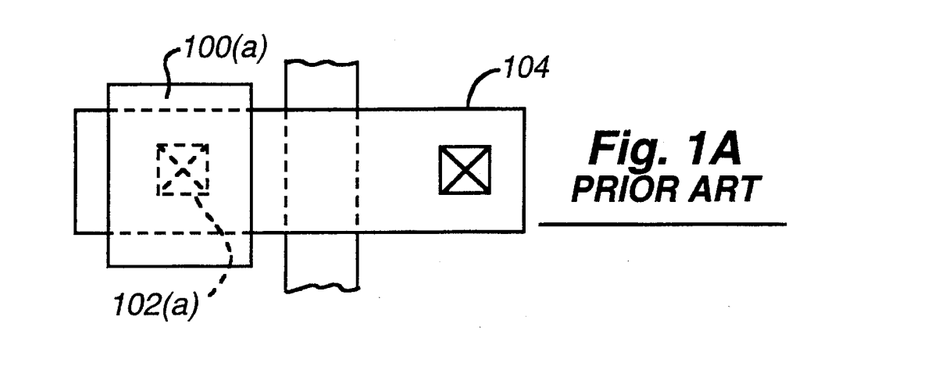
FIG. 1A is a top view of the memory device of FIG. 1.
Figure 2:
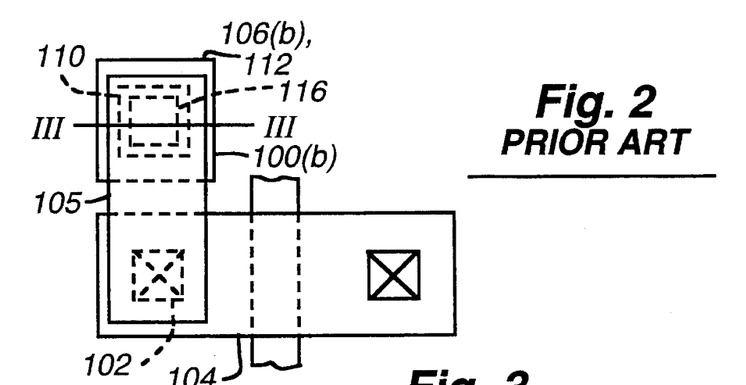
FIG. 2 is a top view of a memory device produced by another prior method.
Figure 3:
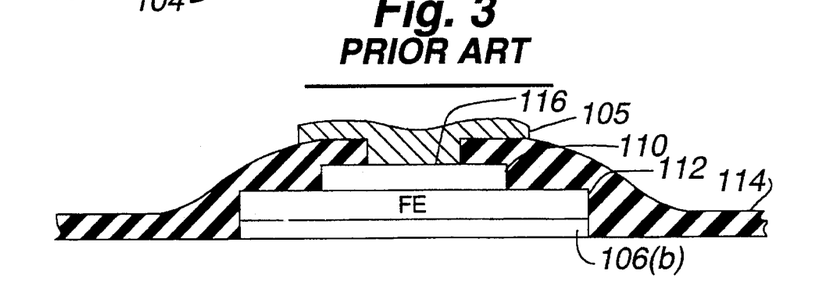
FIG. 3 is a cross-sectional view of the ferroelectric capacitor 100 (b) in FIG. 2 taken along line III—III of FIG. 2.

FIGS. 1-3 show current methods for fabricating a ferroelectric memory cell.

FIGS. 1 and 1A show one current method of fabrication which was described earlier. As shown in these figures, in this method, a ferroelectric capacitor 100(a) is fabricated directly over a bottom electrode 106(a) in a source/drain contact 102(a). Accordingly, the ferroelectric material 100(a) is in contact with a transistor 104 via a source/drain contact 102(a) and a bottom electrode 106(a). However, practical limitations prevent implementation of this method.

Another current method is shown in FIG. 2. As shown in the figure, a ferroelectric capacitor 100(b) is adjacent to transistor 104. A source/drain contact 102 for transistor 104 is connected to capacitor 100(b) by an aluminum connection 105 using aluminum metallization. As seen from the figure, the memory cell formed by this method requires a large area which precludes its use in some (high density) memory products.

FIG. 3 is a cross-sectional view taken along line III—III of ferroelectric capacitor 100(b) in FIG. 2. A top electrode 110 of the ferroelectric capacitor is shown. In the process of making capacitor 100(b), a layer (not shown) for the top electrode 110 is deposited over a ferroelectric material 112 and a bottom electrode 106(b). The top electrode layer is then defined in a lithographic step to form top electrode 110. An insulating layer 114 is then deposited over the top electrode 110. It may be reflowed. A contact window 116 through insulating layer 114 to top electrode 110 is then opened. As stated previously, this requires an oversize top electrode area (so that misalignments of the window can be tolerated).

The method of the present invention comprises a series of fabrication steps which are carried out in the manner set forth below, with reference to a preferred embodiment of using the method.

Figure 4A:
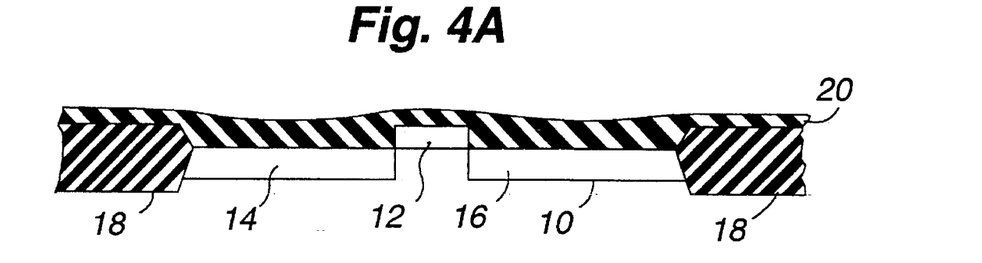
FIG. 4A is a cross-sectional view of a portion of an integrated circuit being constructed according to an embodiment of the present invention showing a first insulating layer overlaying an integrated circuit transistor.

In FIG. 4A, in accordance with the present invention, an integrated circuit transistor 10 is fabricated on a substrate. The integrated circuit transistor can be fabricated by using silicon CMOS, silicon bipolar, or GaAs technology. A field effect transistor ("FET") is shown for illustrative purposes. FET 10 comprises a gate electrode 12, a first source/drain region 14, and a second source/drain region 16. The gate electrode 12 can be either (doped) polysilicon or polycide depending on the choice of production design. Isolation 18, such as field oxide, may be included. As shown in FIG. 4A, a first insulating layer 20 is established, either by deposition or an oxidation process, over transistor 10. Layer 20 is preferably comprised of silicon dioxide, silicon nitride or some combination thereof, such as $SiO_2/SiN/SiO_2$ or $SiN/SiO_2$ layers, to a typical thickness of 500 to 10,000 Å. In addition, the silicon dioxide in layer 20 could further comprise boron and/or phosphorus to accommodate reflow of the insulating layer. Layer 20 may also be an insulating high temperature polymer such as polyimide.

Figure 4B:
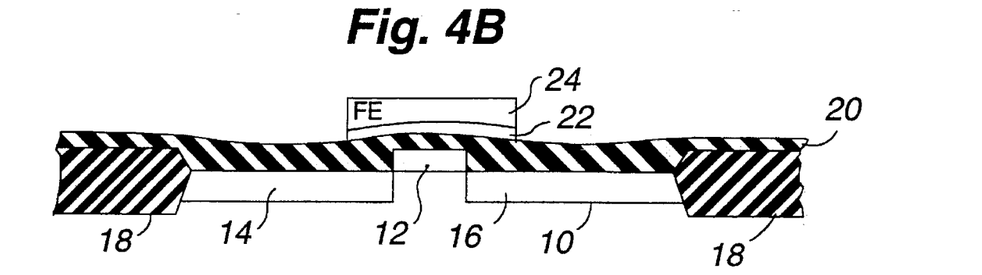
FIG. 4B shows the structure of FIG. 4A with a bottom electrode and a ferroelectric material over the first insulating layer.

Next, a layer for a bottom electrode is established, by deposition for example, over first insulating layer 20. The deposition can be by sputtering or evaporation. The bottom electrode 22 is then defined so that it will be stacked directly above the transistor and over gate electrode 12, as shown in FIG. 4B. The bottom electrode 22 preferably is comprised of titanium and platinum at a thickness of 500 to 5000 Å. The bottom electrode could also be comprised of palladium, alloys of platinum and palladium, and/or conductive oxides. It will be noted that the bottom electrode 22 is, in this embodiment, located centrally with respect to the transistor. Further, it is centered over gate electrode 12, which is a central member of the transistor. Electrode 22 is generally planar, but it need not be to come within the scope of this invention. Electrode 22 can be flat, curved, or have another shape, and it can have a planar (horizontal) or other orientation.

The bottom electrode serves as a common electrode for all the capacitors in a row or column, depending on the circuit schematic. This is accomplished by patterning the bottom electrode and the ferroelectric material as a line connecting many cells. Thus, it is to be understood that the cell of FIG. 4 is one of an array of thousands of like cells in an integrated circuit chip.

A layer of ferroelectric material 24 is then deposited over bottom electrode 22 and defined so that it will be stacked directly above bottom electrode 22 and above the transistor. The deposition of the layer of ferroelectric material can be by sputtering, evaporation, CVD or sol-gel spin-on. The definition of the bottom electrode and the ferroelectric material is done by photolithography followed by ion milling or plasma etching. The bottom electrode layer and then the ferroelectric material can be both deposited and then defined together so that their lateral edges are co-linear.

Figure 5:
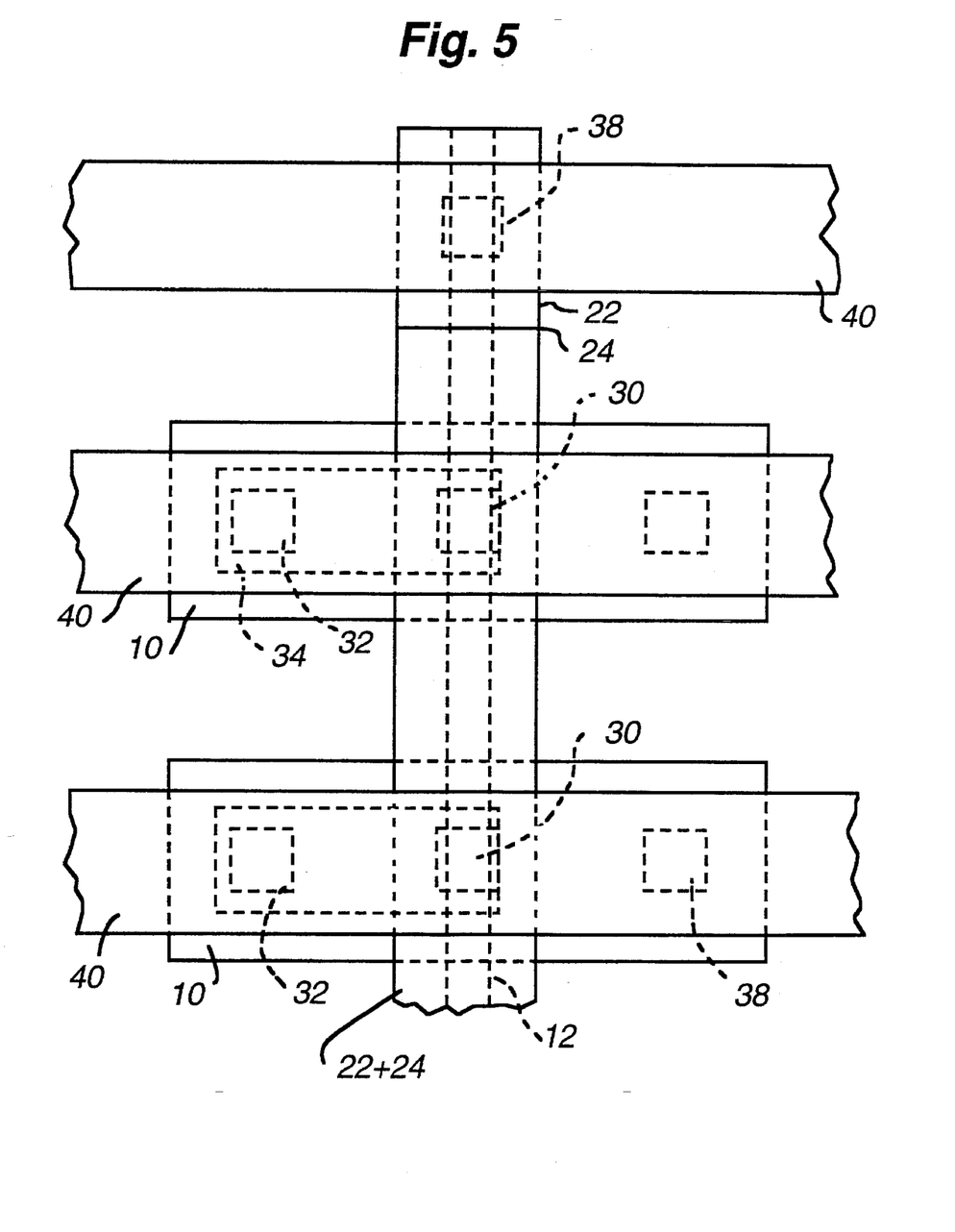
FIG. 5 shows a top view of an array of memory cells with a connection between the bottom electrode and the second interconnect.

Preferably, the bottom electrode layer and the ferroelectric layer are defined separately. When defined separately, a portion of the ferroelectric material will be removed while leaving the bottom electrode intact. Preferably, a contact window 38 is established through second and third insulation layers 26, 36 and bottom electrode 22 to second source/drain region 16. A second interconnect 40 is later established over bottom electrode 22 and in contact with bottom electrode 22 via contact window 38. This is shown in FIG. 5. FIG. 5 shows two memories cells and the connection between bottom electrode 22 and second interconnect 40. It is understood that further memory cells can be part of the array in FIG. 5.

The ferroelectric material 24 preferably comprises lead zirconate titanate, called "PZT", and having the general formula $Pb(Ti_xZr_{1-x})O_3$. The $Pb(Ti_xZr_{1-x})O_3$ stoichiometry can be in the range from X=0.4 to X=1.0. The PZT may also be doped with other elements, such as for example, lanthanum and niobium in a range of about 0.1 % to about 5.0 %, to improve electrical characteristics. The ferroelectric material 24 is the charge storage medium in the memory. It can store charge in either a volatile or non-volatile mode. The charge may be stored as the spontaneous polarization (non-volatile) or the linear charge (volatile).

Figure 4C:
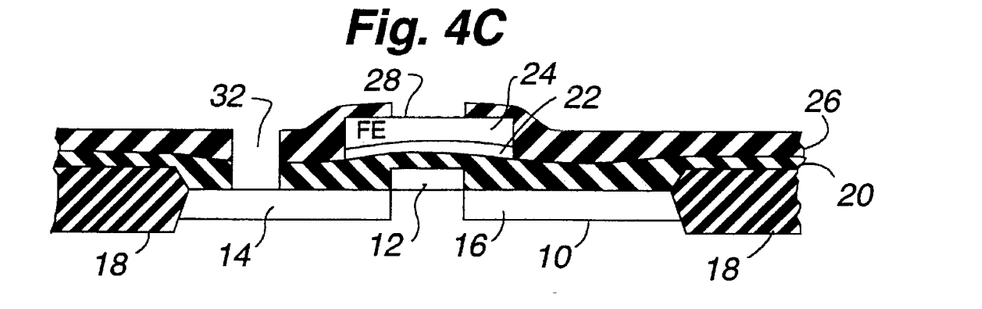
FIG. 4C shows the structure of FIG. 4B with a second insulating layer over the ferroelectric material and a pair of contact windows through the insulation.

A second insulating layer 26 is then established over ferroelectric material 24 and first insulating layer 20. As seen in FIG. 4C, layer 26 extends both over and beside ferroelectric dielectric 24. It may, for example, be deposited, like the first insulating layer. The second insulating layer is preferably comprised of silicon dioxide, silicon nitride, boron, phosphorus, or some combination thereof. Next, as shown in FIG. 4C, a first contact window 28 is established through the second insulating layer 26 to expose the upper surface of the ferroelectric layer 24. Contact window 28 may, for example, be established by photolithography followed by plasma etching. A second contact window 32 is also established through the second insulating layer 26 and the first insulating layer 20 to the first source/drain region 14. Preferably, second contact window 32 is defined at the same time as the first contact window 28. However, second contact window 32 could also be established in a separate step, for example, by using photolithography and plasma etching. Further, second contact window 32 could also be established after the top electrode has been established and defined. At that time, second contact window 32 can be established by defining and etching the window 32. Window 32 is beside the ferroelectric 24.

Figure 4D:
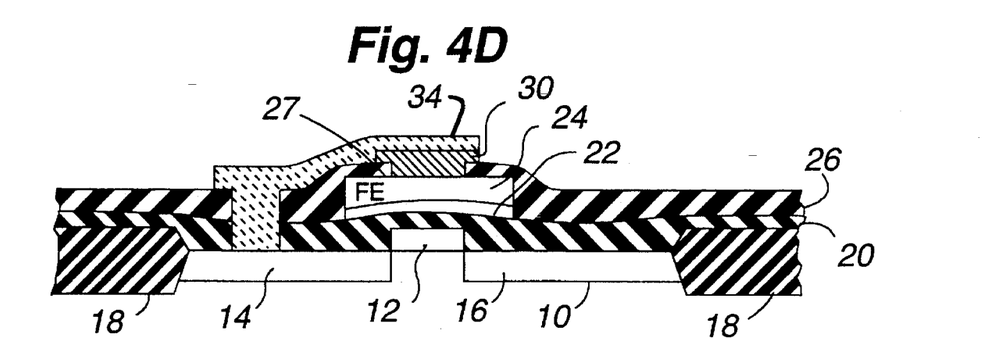
FIG. 4D shows the structure of FIG. 4C with the addition of a top electrode and a first interconnect.

A layer for a top electrode 30 is then deposited over second insulating layer 26 and in first contact window 28 and second contact window 32. The top electrode layer is deposited by sputtering or evaporation and then defined using photolithography, ion milling or plasma etching. During this step, the material of the top electrode can be removed from second contact window 32. FIG. 4D shows the defined top electrode 30. The top electrode preferably comprises platinum. However, the top electrode could also be comprised of palladium, alloys of platinum and palladium and/or conductive oxides. Note that the ferroelectric material is protected from the etching by the insulation 26. The area of the ferroelectric capacitor and thus its capacitance is minimized by defining the geometric size of the electrode using a hole etched in the insulating layer. The size of the ferroelectric capacitor is determined by only one alignment tolerance, the ferroelectric material 24 to insulation layer 26. The area of the capacitor does not contribute to the memory cell area (in plan view) since it is stacked above the transistor. In contrast, in some prior methods, as shown in FIG. 3, the size of the ferroelectric layer is equal to the ferroelectric layer 112 to top electrode 110 alignment tolerance and the top electrode 110 to insulation layer 114 alignment tolerance.

It should be appreciated that in the prior art method of FIG. 3, the top electrode was defined, then covered with insulation, and then the contact window was opened to the top electrode. In the process described herein, the contact window is opened before the top electrode is deposited or defined.

Next, a first interconnect 34, which is preferably a refractory material, is established, preferably by deposition, over top electrode 30, a portion of the second insulating layer 26, and within second contact window 32 so that the top electrode 30 will be coupled electrically via interconnect 34 with first source/drain region 14. The deposition can be by sputtering, evaporation or CVD. The refractory material of first interconnect 34 preferably comprises a refractory metal, a refractory metal nitride, or a refractory metal silicide. Examples of this material include titanium, tungsten, tungsten-titanium alloys, molybdenum, nickel, chromium, titanium nitride, titanium silicide, zirconium nitride, hafnium nitride, tungsten silicide, molybdenum silicide, platinum silicide, or cobalt silicide. In addition, the use of a refractory material improves manufacturability by eliminating the need for a barrier metallurgy between the electrode material and the circuit interconnection metallurgy which is typically aluminum or an aluminum alloy. Interconnect 34 is then etched, leaving the structure of Fig. 4D. Note that in one modification, at least the right edge of electrode 30 and the edges of interconnect 34 could be defined simultaneously. To make the right edge of electrode 30 co-linear with the right edge of interconnect 34, a single etching step could be used.

While it is preferred to have electrode 30 distinct from interconnect 34, and established in separate steps, in a second modification of the invented structure and method, the same material could be used for both structures, applied in a single step. That is to say, once contact windows 28 and 32 have been opened as in FIG. 4C, some structure must be added (a) to add some top electrode to the dielectric 24 thereby to complete the capacitor; and (b) the capacitor must be coupled to an electrode of the transistor, such as the source region 14 in the substrate. A single conductive layer could be added over FIG. 4C and then defined to have the same shape as occupied by members 30 and 34 together in FIG. 4D. However, as in my prior U.S. Pat. No. 5,005,102, it is preferred to use a multi-layer structure for electrodes, so that a first material (such as platinum) may contact the ferroelectric dielectric, and a second material (such as titanium) may contact the first material, and a third material (such as aluminum) can be used for the interconnect over the first or second material. In the preferred embodiment herein, a refractory material is used over a noble metal or conductive oxide.

Figure 4E:
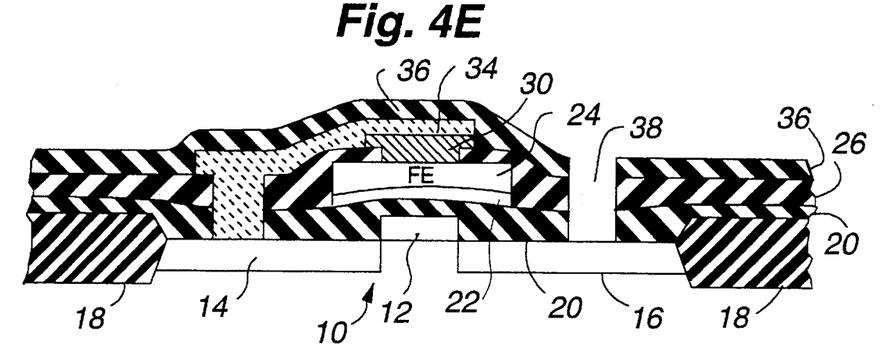
FIG. 4E shows the structure of FIG. 4D with the addition of a third insulating layer and another contact window.

Next, a third insulating layer 36 is deposited or otherwise established over first interconnect 34 and second insulating layer 26. This layer preferably is established in the same manner as the first two insulating layers. Layer 36 preferably comprises silicon dioxide, silicon nitride, boron, phosphorus, or some combination thereof. As shown in FIG. 4E, a third contact window 38 is established through third insulating layer 36, second insulating layer 26, and first insulating layer 20, to expose the upper surface of second source/drain region 16 in the substrate. This contact window is preferably established in the same manner as the first two contact windows.

A second interconnect 40, which can be aluminum, is then established or deposited over third insulating layer 36 and in third contact window 38 so that it will be in contact with the second source/drain region 16. The deposition of the second interconnect can be by sputtering or evaporation. The interconnection can be accomplished by using conventional aluminum metallization techniques. Other conductors can be used instead of aluminum, such as doped polysilicon, other metals, or noble metals, silicides, polycides, refractory metals, refractory metal nitrides, and refractory metal silicides. The preferred interconnect 40 comprises TiN plus either aluminum, 0.5 to 4 % CuAl,0 .5 to 1 % Si—Al or Cu—Si—Al.

Figure 4F:
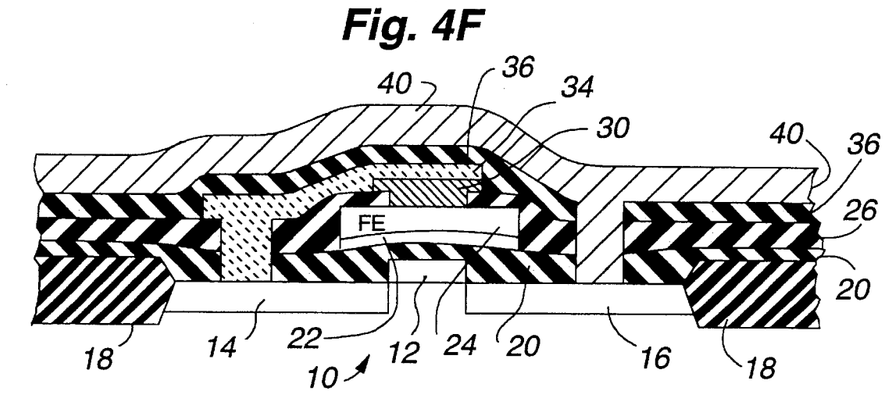
FIG. 4F is a cross-sectional view taken along line A—A of Fig 4G and shows the structure of FIG. 4E with the addition of a second interconnect.
Figure 4G:
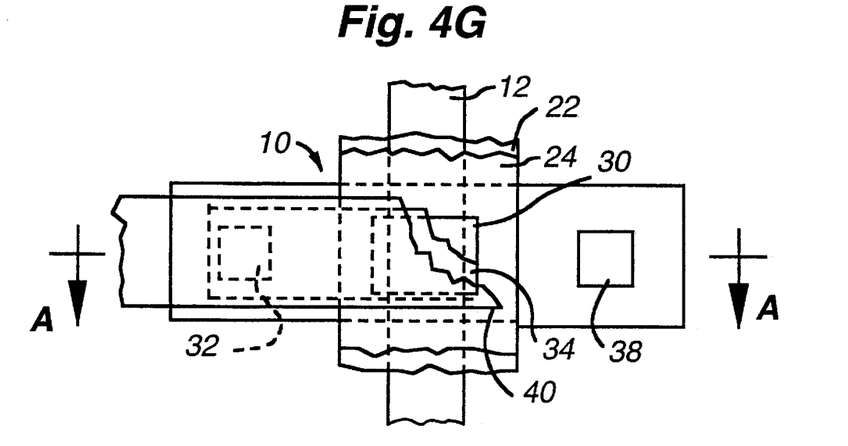
FIG. 4G shows a top view of the completed structure, with parts broken away.

FIG. 4F shows a cross-sectional view of the completed memory cell. This cell can be used in an array on an integrated circuit memory, which would include the typical circuitry such as decoders, sense amplifiers, buffers, and the like. FIG. 4G shows a top view of the complete structure with parts broken away (without the insulation layers which have been removed for illustration purposes only). It will be seen from FIGS. 4F and 4G that the top electrode 30 has a first lateral edge (on the right side thereof) which is shown co-linear with the right lateral edge of interconnect 34. Also, electrode 30 has a second (left) lateral edge which is opposite and parallel to the first (right) lateral edge. The local interconnect 34 also is shown with a second lateral edge which is far to the left of the left edge of electrode 30.

That is, the second lateral edges are laterally spaced apart. Also, the top electrode 30 is seen in FIG. 4G as having third and fourth (top and bottom with reference to the FIG. 4G) lateral edges parallel to each other and at an angle to its left and right lateral edges. It can be seen also in FIG. 4G that the bottom electrode 22, ferroelectric layer 24, and top electrode 30 are generally centrally located over the word line 12.

Additional layers of the second interconnect may be added above second interconnect 40. This layers can be established, for example, by conventional processing techniques. Preferably, these layers will comprise aluminum, but they could also comprise other conductors, such as those listed above for second interconnect 40.

Figure 6:
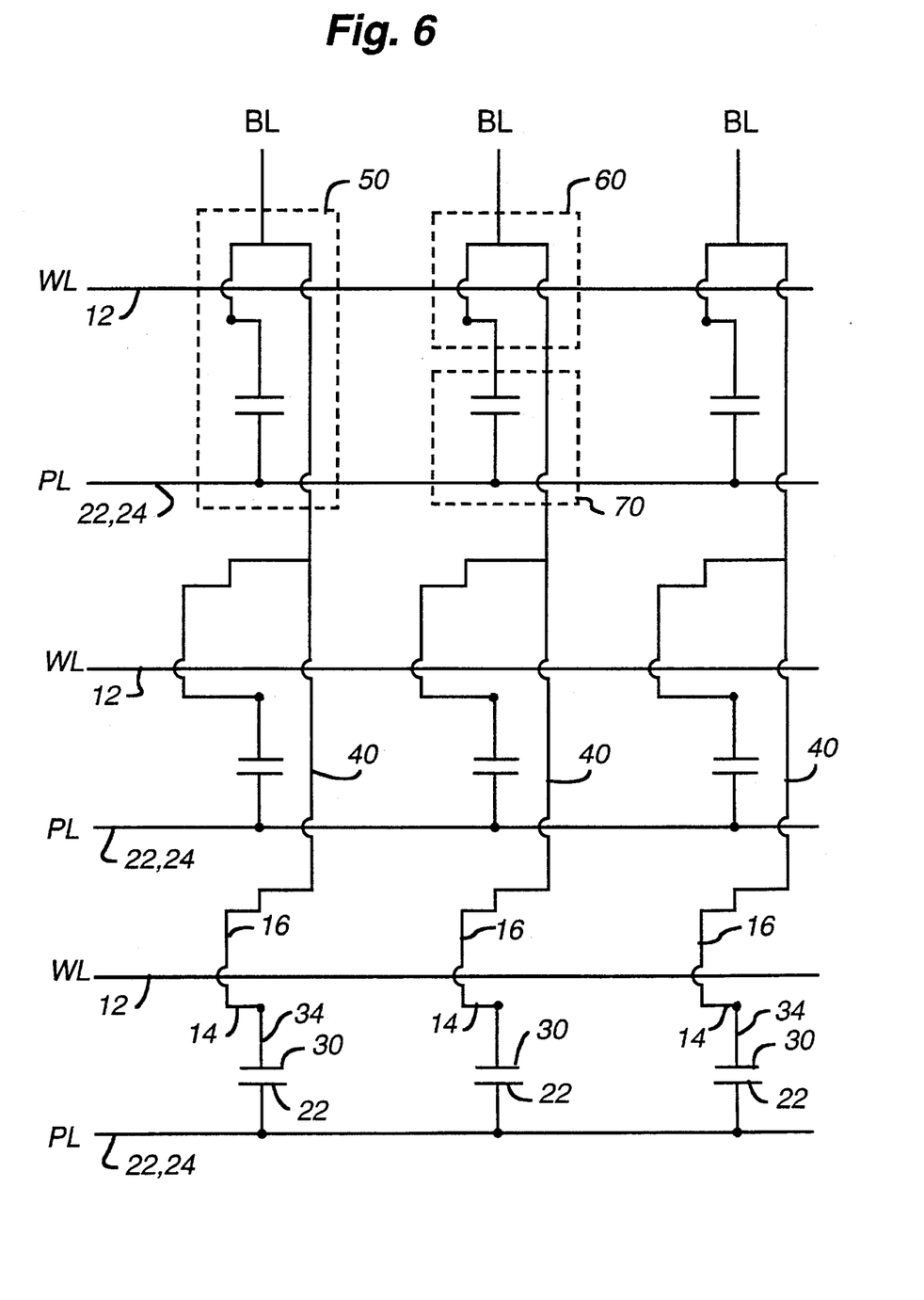
FIG. 6 shows a schematic of a 3×3 array of memory elements of the present invention.

FIG. 6 shows a schematic of a 3×3 array of memory elements of the present invention. The memory cell illustrated in FIG. 4G is shown in the schematic by dotted line 50. Dotted line 60 represents transistor 10 of FIG. 4 while dotted line 70 represents the ferroelectric capacitor of the present invention.

This description has been offered for illustrative purposes only and is not intended to limit the invention of this application, which is defined in the claims below. The present invention is not dependent on the particular substrate material, or on whether epitaph is employed. CMOS technology is compatible with the invention also.

I claim:

1. A method for forming an integrated circuit memory cell comprising the steps of:

forming a transistor having active regions and a gate;

establishing first insulation over said transistor;

establishing a bottom electrode and a ferroelectric dielectric upon the insulation over said gate;

establishing second insulation over the ferroelectric dielectric;

exposing a selected portion of an upper surface of the ferroelectric dielectric; and establishing a top electrode at least partially over said gate coupled electrically between the exposed selected portion of the ferroelectric dielectric and one of said active regions of the transistor.

2. The method of claim 1 wherein the step of establishing a top electrode comprises the steps of forming a first portion of said top electrode and forming a contact portion interconnecting said one region of said transistor.

3. The method of claim 1 wherein said step of establishing a top electrode includes locating said top electrode to completely overlie said gate.

4. The method of claim 1 wherein said step of establishing a bottom electrode comprises forming a generally planar electrode.

5. The method of claim 1 wherein said step of establishing a top electrode includes establishing a top electrode and then establishing an interconnect coupled thereto.

6. The method of claim 5 wherein the step of establishing the top electrode includes defining at least one lateral edge of the top electrode and subsequently adding material to establish the interconnect.

7. The method of claim 6 wherein the step of establishing the top electrode includes etching another lateral edge of the top electrode simultaneously with etching one lateral edge of the interconnect.

8. The method of claim 7 further comprising forming the interconnect lateral edge co-linearly with said another lateral edge of the top electrode.

9. The method of claim 1 wherein said bottom electrode and said ferroelectric dielectric are established in separate steps so that a portion of said bottom electrode is not covered by said ferroelectric dielectric and when an interconnect is established over said bottom electrode, said bottom electrode is in contact with said interconnect through a contact window through said second insulation.

10. A method for forming a ferroelectric memory cell comprising the steps of:

forming an integrated circuit transistor having first and second active regions and a gate;

establishing a first insulating layer over said integrated circuit transistor;

depositing a bottom electrode over said gate over said first insulating layer;

depositing ferroelectric material over said bottom electrode;

defining said bottom electrode and said ferroelectric material;

establishing a second insulating layer over said ferroelectric material and said first insulating layer;

establishing a first contact window through the second insulating layer to said ferroelectric material;

establishing a second contact window through the second insulting layer and the first insulating layer to a first region of said transistor;

establishing a top electrode over said gate over said ferroelectric material and said second insulating layer; establishing a first interconnect over said top electrode, over said second insulating layer and in said second contact window to provide a conductive path from said top electrode to said first active region of the transistor;

establishing a third insulating layer over said first interconnect and said second insulating layer; and establishing a second interconnect coupled to second active region of the transistor.

11. The method of claim 10 wherein a capacitor formed by said top and bottom electrodes are located within a perimeter containing said transistor.

12. The method of claim 10 including the step of establishing a third contact window through said first, second, and third insulating layers to the second active region of said transistor.

13. The method of claim 12 wherein a capacitor formed by said top and bottom electrodes are located within a perimeter containing said transistor.

14. The method of claim 10 wherein said first, second, and third insulating layers are selected from the group consisting of silicon dioxide, silicon nitride, and a combination of silicon dioxide and silicon nitride.

15. The method of claim 10 wherein said bottom electrode is selected from the group consisting of titanium, platinum, palladium, an alloy of platinum, an alloy of palladium, and a conductive oxide.

16. The method of claim 10 wherein said ferroelectric material comprises $Pb(Ti_x Zr_{1-}) O_3$ wherein x is from 0.4 to 1.0.

17. The method of claim 10 wherein said top electrode is selected from the group consisting of platinum, palladium, an alloy of platinum, an alloy of palladium, and a conductive oxide.

18. The method of claim 10 wherein said first interconnect is a refractory material.

19. The method of claim 18 wherein said refractory material is selected from the group consisting of: a refractory metal, a refractory metal nitride, and a refractory metal silicide.

20. The method of claim 18 wherein said refractory material is a material selected from the group consisting of titanium, tungsten, tungstentitanium alloy, molybdenum, nickel, chromium, titanium nitride, titanium silicide, zirconium nitride, hafnium nitride, tungsten silicide, molybdenum silicide, platinum silicide, and cobalt silicide.

21. The method of claim 10 wherein said bottom electrode and said ferroelectric material are defined in separate steps whereby a portion of said bottom electrode is not covered by said ferroelectric material and when said second interconnect is established over said bottom electrode, said bottom electrode is in contact with said second interconnect through a third contact window through said insulation.

* * * * *